United States Patent [19]
Yamashita et al.

[11] Patent Number: 5,355,322
[45] Date of Patent: Oct. 11, 1994

[54] AUTOMATIC ROUTING METHOD AND DEVICE

[75] Inventors: Noboru Yamashita; Toshiyuki Katada, both of Owariasahi, Japan

[73] Assignee: Hitachi, Ltd., Tokyo, Japan

[21] Appl. No.: 755,436

[22] Filed: Sep. 5, 1991

[30] Foreign Application Priority Data

Sep. 12, 1990 [JP] Japan .................. 2-240015

[51] Int. Cl.⁵ .......................................... G06F 15/60
[52] U.S. Cl. .................. 364/490; 364/489; 364/488
[58] Field of Search ............... 364/488, 489, 490, 491

[56] References Cited

U.S. PATENT DOCUMENTS

| | | | |
|---|---|---|---|
| 4,495,559 | 1/1985 | Gelatt, Jr. et al. | 364/491 |
| 4,630,219 | 12/1986 | DiGiacomo et al. | 364/491 |
| 4,815,003 | 3/1989 | Putatunda et al. | 364/491 |

FOREIGN PATENT DOCUMENTS 01-225335  9/1989  Japan .

OTHER PUBLICATIONS

"A Block Interconnection Algorithm for Hierarchical Layout System" by Fukin et al., IEEE Trans. on Computer-Aided Design, vol. CAD-6, No. 3, May 1987, pp. 383–390.

*Primary Examiner*—Vincent N. Trans
*Attorney, Agent, or Firm*—Fay, Sharpe, Beall, Fagan, Minnich & McKee

[57] ABSTRACT

An automatic routing is executed in the conventional manner for circuit components located at predetermined positions. Any unconnected place of the circuit is searched and the arrangement of the components relative to the unconnected place is modified. The automatic routing is performed again for the components the arrangement of which has been modified. Thus, the unconnected place can be eliminated from the circuit for a short time.

9 Claims, 4 Drawing Sheets

FIG. 5
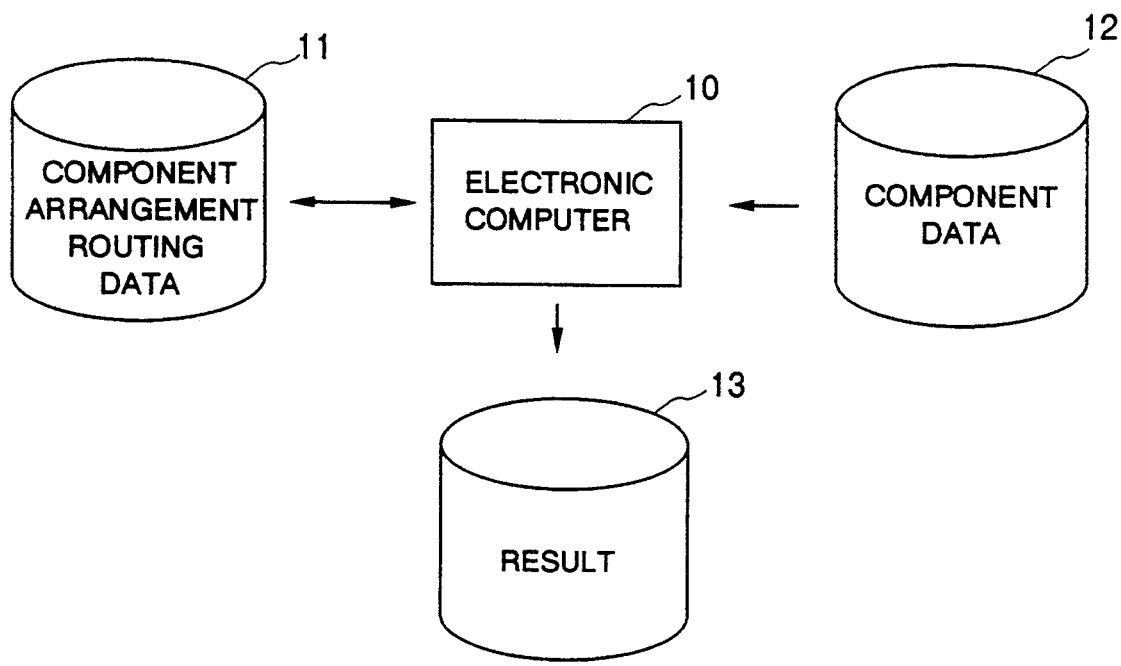
FIG. 6
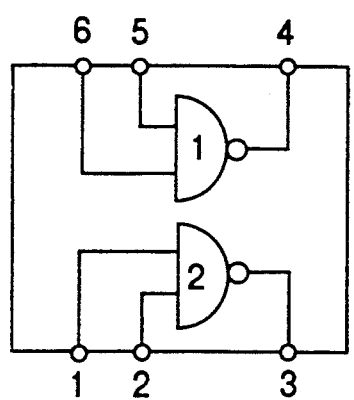
FIG. 7
| NAME : 6PIN×× | | | |
|---|---|---|---|
| PRODUCT NAME : TTL×× | | | |
| PIN No. | GATE No. | GATE NAME | PIN EXCHANGE GRUUP |
| 1 | 1 | NAND 2 | i1 |
| 2 | | | i1 |
| 3 | | | O1 |
| 4 | 2 | NAND 2 | O1 |
| 5 | | | i1 |
| 6 | | | i1 |

AUTOMATIC ROUTING METHOD AND DEVICE

BACKGROUND OF THE INVENTION

The present invention relates to an automatic routing method and device, and more particularly to an automatic routing method suited to automatically design, using an electronic computer, the routing paths among components of a circuit or printed circuit board or the connecting paths among the pins inside an LSI.

Previously known automatic routing methods are a 'mage method', a 'line search method', etc.

JP-A-1-225335 discloses the method in which first, the layout of components constituting a circuit is decided, automatic routing is made on the basis of the layout decided, and the place(s) unconnected as a result of the automatic routing is routed again to another path by removing the routing path which is an obstacle for the unconnected state, thereby minimizing the number of unconnected wirings.

Although the above prior art discloses a technique of re-routing the places unconnected as a result of automatic routing, it should be noted that only the route is modified in re-routing, and the circuit components have already been placed prior to automatic routing using e.g. the algorithm (optimal placement method) for uniforming the routing density.

SUMMARY OF THE INVENTION

An object of the present invention is to provide a new automatic routing method and device.

Another object of the present invention is to make a routing path as short as possible and to remedy the places unconnected from a circuit. More specifically, if the circuit components are fixed at predetermined positions, as the case may be, it is impossible to physically connect the components with each other. Even if possible, the routing path becomes too long owing to redundant detouring. Therefore, the present invention intends to obviate these cases, and to provide an automatic routing method which can make the routings with excellent electrical characteristics among the components.

In order to remedy the places unconnected and to make the routing path as short as possible, it is necessary to rearrange the circuit components and make the routing for the components rearranged. However, in order to execute the optimal placement method for the components again and further apply the automatic routing method such as the mage method to the components rearranged, the current electronic computer takes a very long time.

The inventors of the present invention thought that if only the components related to the above inconvenience of routing were rearranged and automatic rerouting was made for these components, the processing time taken might be shortened.

In short, another object of the present invention is to provide an automatic routing method which can be executed in a short time.

The present invention intends to attain these objects. In the present invention, first, an automatic routing method is executed in the conventional manner for the circuit components placed at predetermined positions by e.g. the optimal placement method. An unconnected place(s) of the circuit is searched to rearrange the component(s) related to the unconnected place(s). Next, again, the automatic routing method is executed for the component rearranged. The first automatic routing and the second routing are preferably executed on the same logic in order to reduce the labor of software. The above series of processings are repeated to eliminate at least the unconnected place(s) from the circuit.

BRIEF DESCRIPTION OF THE DRAWINGS

FIG. 5 is a block diagram showing one embodiment of the automatic routing system to which the automatic routing method according to the present invention is applied.

FIG. 6 is a view showing the state where two two-input NAND gates reside in one component; and FIG. 7 is a table defining component information which permits pins, gates and components themselves to be replaced for the components shown in FIG. 6.

DESCRIPTION OF THE PREFERRED EMBODIMENTS

Figure 1:
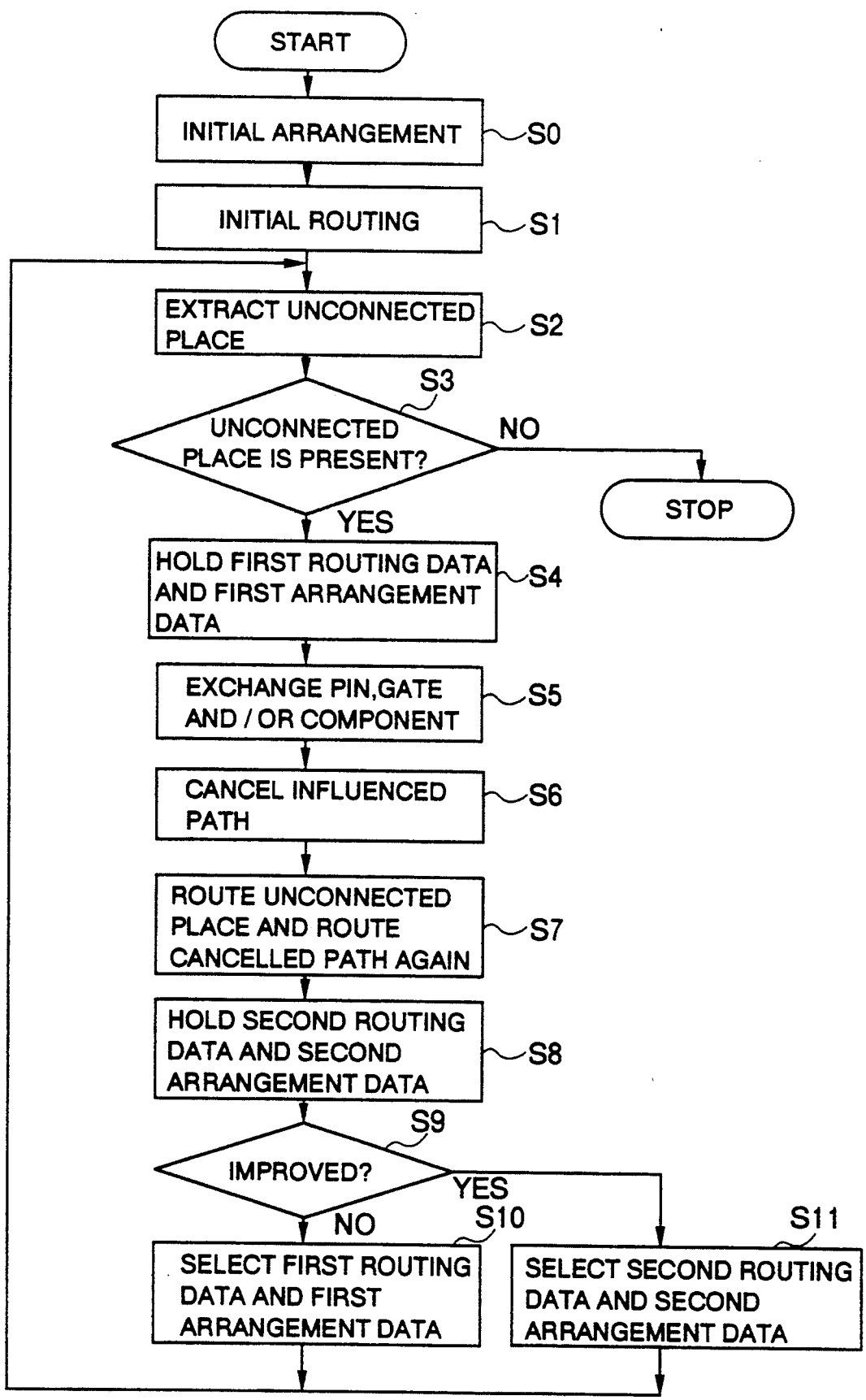
FIG. 1 is a flowchart showing one embodiment of the automatic routing method according to the present invention.

FIG. 1 is a flowchart showing one embodiment of the automatic routing method according to the present invention.

As shown in FIG. 1, first, in Step S0, the layout of the circuit components is determined. This determination can be made by e.g. the conventional optimal placement method. In Step S1, initial automatic routing is executed by the conventional mage method or line search method. The initial automatic routing decides a routing path using several routing algorithm and thereafter improves the routing shape.

In Step S2, an unconnected place(s) is extracted on the basis of the result of the initial automatic routing. In Step S3, decision is made if or not there is any unconnected places. If the decision that there is no unconnected place is made in Step S3, the processing is completed.

If the decision that there is some unconnected places is made in Step S3, in Step S4, the routing state obtained is Step S2 and the arrangement state of components and pins for which the initial automatic routing in Step S1 is made are stored in a memory 11 shown in FIG. 5 as first routing data and first arrangement data, respectively.

In Step S5, with respect to a certain unconnected place, the arrangement of its pins, gates and/or components is modified. In Step S6, the routing path, e.g. an inter-pin routing, influenced from the modification in Step S5 is canceled. In Step S7, automatic routing is made again for the unconnected path and the routing path canceled in Step S6. In Step S8, the routing state and the arrangement state of components are stored in the memory 11 as second routing data and second arrangement data, respectively.

In Step S9, by comparing the first and second routing data, decision is made on if or not the routing result in Step S7 has been improved as compared with the initial routing result in Step S1. The comparison is executed on the basic of the number of unconnected pattern. If the answer is 'YES', in Step S9, the second and routing data and the second arrangement data are selected. If the answer is 'NO', in Step S10, the first routing data and the first arrangement data are selected. Namely, the routing state and the arrangement state of components are returned to the initial states, respectively.

Regarding as the data selected in Step S10 or S11 as representing the initial routing and arrangement, the steps S2 to S11 are repeated.

Additionally, it is assumed in the above embodiment that the first and second routing data and the first and second arrangement data are in the same range as the initial routing and arrangement, i.e. are data relative to the entire circuit. However, there items of data may represent only the routing state and arrangement relative to the unconnected place; in this case they are data relative to a part of the circuit. The initial routing and arrangement are modified using these items of data.

Further, in this embodiment, in Step S5, the arrangement of pins, gates and/or components was modified. The present invention should not be limited to such modification. For example, the following modification may be made for the same unconnected place. The pin arrangement is first modified in Step S5. If the decision of no improvement is made in Step S9, the gate arrangement is modified in Step S5 in a next cycle of processing. Nevertheless, if the decision of no arrangement is made again, the component arrangement is modified in Step S5 in a further next cycle of the processing. Nevertheless, the decision of no improvement is made again, the combination of these modifications is made in a further next cycle of processings.

Now referring to FIGS. 2A, 2B, 3A, 3B, 4A and 4B, a concrete explanation will be given of the processings made in Steps S5 to S7 (in which the arrangement of components for which the initial automatic routing has been made is modified for only the unconnected place and routing is made on the basis of the modification).

Figure 2A:
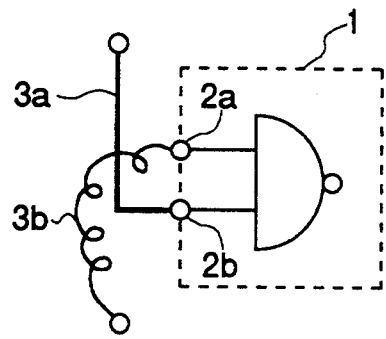
FIGS. 2A, 3A and 4A are circuit diagrams showing the unconnected states due to inconvenience of a pin arrangement, gate arrangement and a component arrangement, respectively.
Figure 3A:
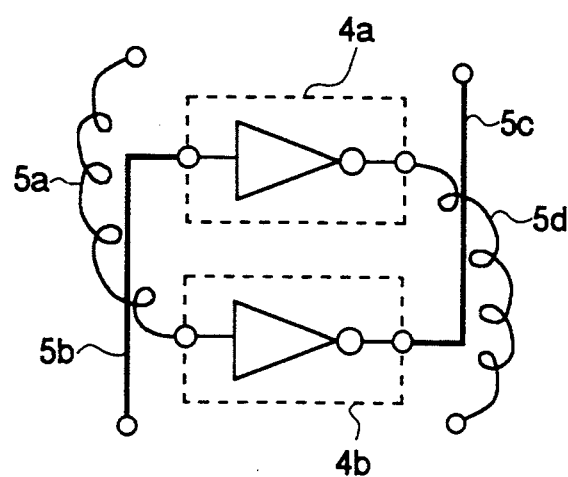
Figure 4A:
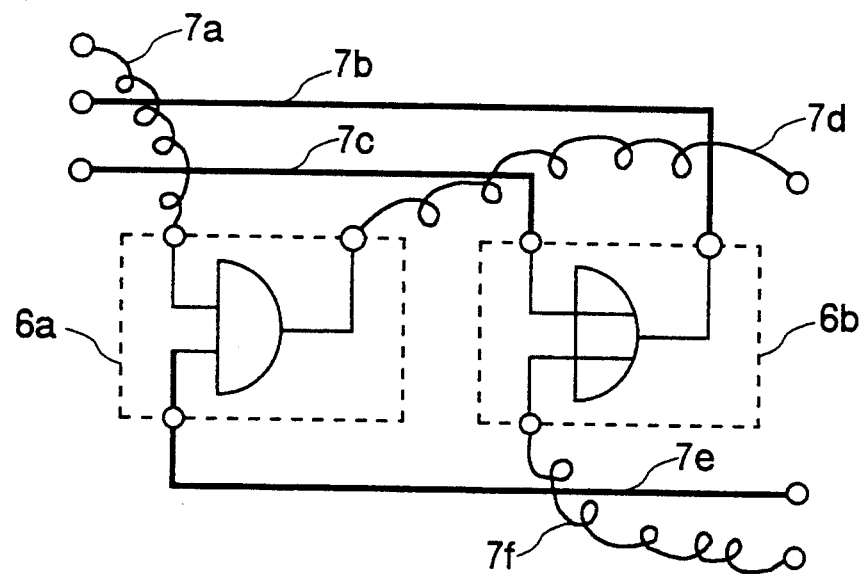

Generally, some unconnected places occur as a result of the initial automatic routing in Step S1. This is due to several causes. For example, if the component arrangement is poor, the routing paths may be in a crossed state so that the possibility of inducing an unconnected state is enhanced. FIGS. 2A, 3A and 4A show the unconnected states due to that the pin, gate and component arrangements are poor, respectively.

FIG. 2a shows a defined routing path 3a and an unconnected routing path 3b corresponding to pins 1 and 2 of a gate 1 formed as a result of the initial automatic routing. The gate 1 may be a part of a certain component or an independent gate.

Figure 2B:
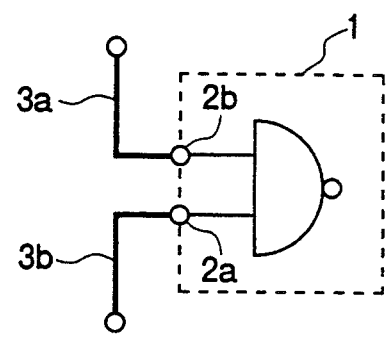
FIGS. 2B, 3B and 4B are circuit diagrams showing the states free from the unconnected states shown in FIGS. 2A, 3A and 4A, respectively.

FIG. 2B shows the state where the pins 2a and 2b of the gate 1 shown in FIG. 2A are routed again by pin exchange to remedy the unconnected routing path 3b.

FIG. 3A shows defined routing paths 5b and 5c and unconnected routing paths 5a and 5d relative to gates 4a and 4c formed as a result of the initial automatic routing. The gates 4a and 4b may be a part of a certain component or an independent gate.

Figure 3B:
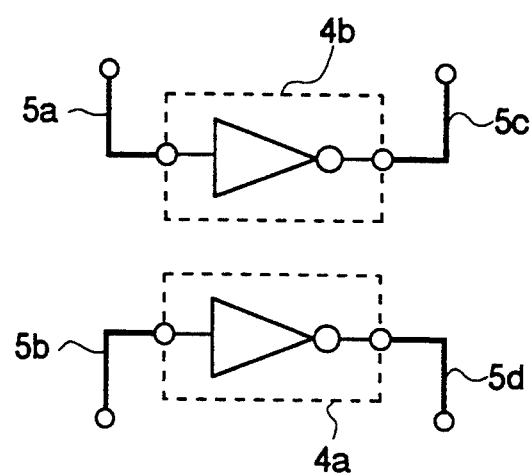

FIG. 3B shows the state where the gates 4a and 4b shown in FIG. 3A are routed again by replacement to remedy the unconnected routing paths 5a and 5b. If the gates 4a and 4b are not independent but a part of the component in FIGS. 3A and 3B, the replacement of the gates 4a and 4b means that of components. In this case, the routing paths of the other place of the components (not shown) are routed again.

Additionally, in the example of FIG. 3A, re-routing the gates 4a and 4b after pin exchange therefor as well as replacement of the gates 4a and 4b permits the unconnected routing paths 5a and 5b to be remedied.

FIG. 4A shows defined routing paths 7b, 7c and 7e and unconnected routing paths 7a, 7d and 7f relative to gates 6a and 6c having different functions formed as a result of the initial automatic routing. The gates 6a and 6b may be a part of a certain component or an independent gate.

Figure 4B:
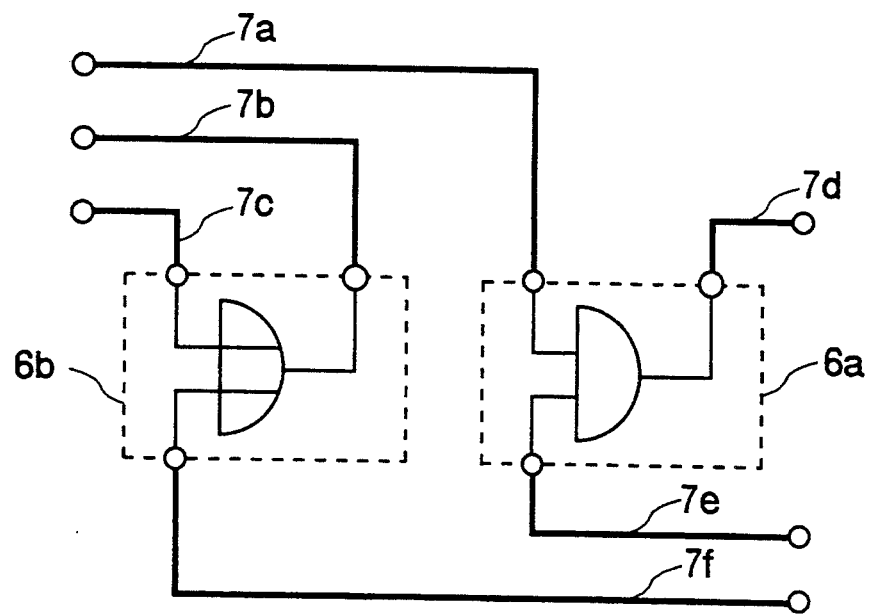

FIG. 4B shows the state where the gates 6a and 6b shown in FIG. 4A are routed again by replacement to remedy the unconnected routing paths 7a, 7d and 7f. If the gates 6a and 6b are not independent but a part of the component in FIGS. 4A and 4B, the replacement of the gates 6a and 6b means that of components. In this case, the routing paths of the other place of the components (not shown) are routed again.

FIG. 5 is a block diagram showing one embodiment of an automatic routing system to which the automatic routing method according to the present invention is applied. As shown in FIG. 5, the automatic routing system is composed of an electronic computer 10, and first to third memories 11, 12 and 13. The first memory 11 stores the first and second routing data and the first and second arrangement data. The second memory 12 stores the data relative to components as shown in FIG. 7. The third memory 13 holds the routing state and component arrangement state after the processings as shown in FIG. 1 have completed. In short, the circuit is designed on the basis of the results held in the third memory 13. In a usual process, checking is made on if or not the circuit at issue satisfies a design criterion and thereafter its result is outputted through CAM.

FIGS. 6 and 7 explain one example of the component data stored in the second memory 12 shown in FIG. 5. FIG. 6 shows the state where two two-input NAND gates reside in one component. FIG. 7 is a table defining component information which permits pins, gates and components themselves to be replaced for the components shown in FIG. 6.

The component shown in FIGS. 6 and 7, as shown, is provided with six pins consisting of pin Nos. 1 to 6, and composed of a two-input NAND gate (No. 1) having pins Nos. 1 to 3 and another two-input NAND gate having pins Nos. 4 to 6 (No. 2).

As seen from FIG. 7, each of the two-input NAND gates Nos. 1 and 2 are labeled the same gate name 'NAND 2'. The pin exchange group represents the group of pins exchangeable in the gate with the same gate number. Therefore, the pin No. 1 and the pin No. 2, which are included in the pin exchange group il of the two-input NAND gate with the gate No. 1, are exchangeable. Likewise, the pin No. 5 and the pin No. 6, which are included in the pin exchange group il of the two-input NAND gate with the gate No. 2, are exchangeable.

Further, as seen from FIG. 7, the same gate name means that the gates with this name are exchangeable. Therefore, the two-input NAND gate with the gate No. 1 and the two-input NAND gate with the gate No. 2 are exchangeable by each other. Then, the pin exchange group il represents the corresponding pins. Therefore, the pins Nos. 1 and 2 can be exchanged by the pins Nos. 5 and 6.

If the components have equal sizes and number of pins, and so are exchangeable, they are labeled the same name (even if they have different product names).

Since the above component information is stored in the second memory 12 in FIG. 5, the electronic computer 10 permits the pin, gate and/or component arrangement to be exchanged for their re-routing.

We claim:

1. An automatic routing method for automatically routing circuit components, comprising the steps of:
 a first step of automatically routing, in accordance with a prescribed logic, an arrangement of circuit components located at predetermined positions to form a first pattern;
 a second step of deciding whether the first pattern includes an unconnected place;
 a third step of modifying the arrangement of circuit components related to said unconnected place when it is decided that the first pattern includes an unconnected place; and
 a fourth step of automatically routing the modified arrangement of circuit components to form a second pattern which does not include the unconnected place.

2. An automatic routing method according to claim 1, wherein the automatic routing in the fourth step is performed in accordance with said prescribed logic in the first step.

3. An automatic routing method according to claim 1, wherein modifying the arrangement of circuit components in the third step includes exchanging the circuit components themselves, their gates and their pins and the combination thereof.

4. An automatic routing method according to claim 1, wherein the second step to the fourth step are repeated.

5. An automatic routing method for automatically routing circuit components, comprising the steps of:
 a first step of automatically routing, in accordance with a prescribed logic, an arrangement of circuit components located at predetermined positions to form a pattern;
 a second step of deciding whether the pattern includes an unconnected place;
 a third step of completing the processing if it is decided that the pattern does not include an unconnected place;
 a fourth step of, if it is decided that the pattern includes an unconnected place, holding an arrangement state of the circuit components as first arrangement data and holding a routing state associated with the arrangement of circuit components as first routing data;
 a fifth step of modifying the arrangement of circuit components related to the unconnected place;
 a sixth step of canceling a part of the pattern which is not usable owing to modifying the arrangement of circuit components in the fifth step;
 a seventh step of automatically routing the unconnected place decided in the second step and the canceled part of the pattern of the sixth step;
 an eighth step of holding, as second arrangement data, the arrangement state of circuit components modified in the fifth step;
 a ninth step of holding, as second routing data, the routing state obtained in the seventh step;
 a tenth step of comparing the first routing data with the second routing data, and selecting one of them on the basis of the comparison; and
 an eleventh step of repeating the second step to the ninth step wherein the routing data selected in the tenth step and its corresponding arrangement data become the pattern of the second step.

6. An automatic routing method according to claim 5, wherein the automatic routing in the seventh step is performed in accordance with a prescribed logic.

7. An automatic routing method according to claim 5, wherein modifying the arrangement of circuit components in the fifth step includes exchanging the circuit components themselves, their gates and their pins and the combination thereof.

8. An automatic routing method for automatically routing circuit components, comprising the steps of:
 a first step of automatically routing, in accordance with a prescribed logic, an arrangement of circuit components located at predetermined positions to form a pattern;
 a second step of deciding whether the pattern includes an unconnected place;
 a third step of completing the processing if it is decided that the pattern does not include an unconnected place,
 a fourth step of, if it is decided that the pattern includes an unconnected place, holding an arrangement state of the circuit components as first arrangement data and holding a routing state associated with the arrangement of circuit components as first routing data;
 a fifth step of modifying the arrangement of circuit components related to the unconnected place;
 a sixth step of canceling a part of the pattern which is not usable owing to modifying the arrangement of circuit components in the fifth step;
 a seventh step of automatically routing the unconnected place decided in the second step and the canceled part of the pattern of the sixth step;
 an eighth step of holding, as second arrangement data, the arrangement state of circuit components modified in the fifth step;
 a ninth step of holding, as second routing data, the routing state obtained in the seventh step;
 a tenth step of comparing the first routing data with the second routing data, and selecting one of them on the basis of the comparison; and
 an eleventh step of repeating the second step to the ninth step modifying the arrangement state of circuit components and the routing state in the first step on the basis of the routing data selected in the tenth step and its corresponding arrangement data.

9. An automatic routing device for automatically routing circuit components comprising:
 a first means for automatically routing, in accordance with a prescribed logic, an arrangement of circuit components located at predetermined positions to form a pattern;
 a second means for deciding whether the pattern includes an unconnected place;
 a third means for modifying the arrangement of circuit components related to the unconnected place if it is decided that the pattern formed by the second means includes an unconnected place; and
 a fourth means for automatically routing the modified arrangement of circuit components.

* * * * *